United States Patent [19]
Robinson

[11] 3,945,461

[45] Mar. 23, 1976

[54] SOUND SPEAKER SYSTEM

[76] Inventor: Ralph J. Robinson, 121 W. McFarlane Drive, Ventura, Calif. 93001

[22] Filed: Oct. 16, 1974

[21] Appl. No.: 515,080

[52] U.S. Cl. ................ 181/153; 181/148; 181/156; 181/199

[51] Int. Cl.² ........................................... H05K 5/00

[58] Field of Search ........... 181/153, 156, 148, 199, 181/145, 146

[56] References Cited

UNITED STATES PATENTS

| | | | |
|---|---|---|---|
| 3,151,699 | 10/1964 | Peavey | 181/156 |
| 3,393,766 | 7/1968 | Mitchell | 181/153 |
| 3,394,773 | 7/1968 | Kowalik et al. | 181/145 |
| 3,750,838 | 8/1973 | Pyle, Jr. | 181/153 |
| 3,834,485 | 9/1974 | Doschek et al. | 181/146 |

*Primary Examiner*—Stephen J. Tomsky
*Attorney, Agent, or Firm*—Ralph B. Pastoriza

[57] ABSTRACT

The sound speaker system comprises an elongated vertical cylinder having an overall length equal to an integral multiple of its inside diameter. The cylinder is open at its upper and lower ends and a loudspeaker is positioned adjacent its lower end. The diameter of the loudspeaker cone is equal to one-half the inside diameter of the cylinder. The system is designed to be placed in the corner of a room so that sound emanating from the lower and upper ends is reflected by the floor and ceiling corners respectively into the room.

3 Claims, 6 Drawing Figures

SOUND SPEAKER SYSTEM

This invention relates generally to sound and more particularly to an improved sound speaker system for enhancing the enjoyment of music and the like.

BACKGROUND OF THE INVENTION

The prior art is prolific with respect to various types of loudspeaker designs for use in music systems. Known speaker systems range from extremely compact type speakers within baffled cabinets to fairly large rectangular-shaped speaker cabinets incorporating one or more loudspeakers.

Most speakers of the foregoing type, particularly sophisticated versions, are relatively expensive. Further, while the baffling in such speakers is theoretically based on computations of wave lengths so as to enhance certain frequencies in the sound spectrum, there generally are provided many speakers in a single cabinet in order to properly cover this spectrum. For example, relatively large speakers are provided to enhance bass tones while smaller or "tweeter" type speakers are used for the higher frequencies. In addition to the expense of multiple speakers per se in a given cabinet structure, when more than one speaker is used, impedance matching problems arise and thus further expense is involved in assuring maximum power transfer between the output from an amplifier and the input to the speaker system.

From the foregoing, the relatively high cost of speaker systems can be appreciated.

BRIEF DESCRIPTION OF THE PRESENT INVENTION

The present invention contemplates a sound speaker system which utilizes only a single speaker and a unique enclosure arrangement which provides the desired enhancement of various frequencies in the sound spectrum and yet is extremely economical to manufacture and very simple to use all to the end that substantial money can be saved without appreciable sacrifice in sound quality.

More particularly, in accord with the present invention there is provided an elongated cylinder preferably vertically disposed and having upper and lower open ends. The cylinder is dimensioned such that its length constitutes an integral multiple, greater than 2, of its inside diameter.

A loudspeaker in turn is positioned adjacent the lower open end of the elongated cylinder. The speaker itself is selected to have a nominal diameter equal to one-half the inside diameter of the cylinder.

In a preferred embodiment, a secondary cylinder is provided telescopically receiving the elongated cylinder so that the overall length can be made equal to at least one integral greater than the integral multiple of the inside diameter. As a specific example, if an 8 inch diameter cone speaker is used (20.32 centimeters), the inside diameter of the cylinder would be 16 inches, (40.64 centimeters), and the overall length of the cylinder if an integral multiple of three is chosen would be 48 inches (121.92 centimeters). In the case of utilizing the secondary cylinder, the overall length can be made equal to 64 inches (162.56 centimeters). The speed of sound at a temperature of 72°F is 1133.2 feet per second ($3.45 \times 10^4$cm./second). The two basic dimensions for the cylindrical length of 48 inches and 64 inches (121.92 centimeters and 162.56 centimeters) with slight adjustments for different ambient temperatures in organ pipe theory will result in an enhancement of all of the desirable frequencies and harmonics in the sound spectrum.

It will be appreciated from the foregoing that an extremely economical sound speaker system is thus provided.

BRIEF DESCRIPTION OF THE DRAWINGS

A better understanding of the invention will be had by now referring to the accompanying drawings in which.

DETAILED DESCRIPTION OF THE INVENTION

Figure 1:
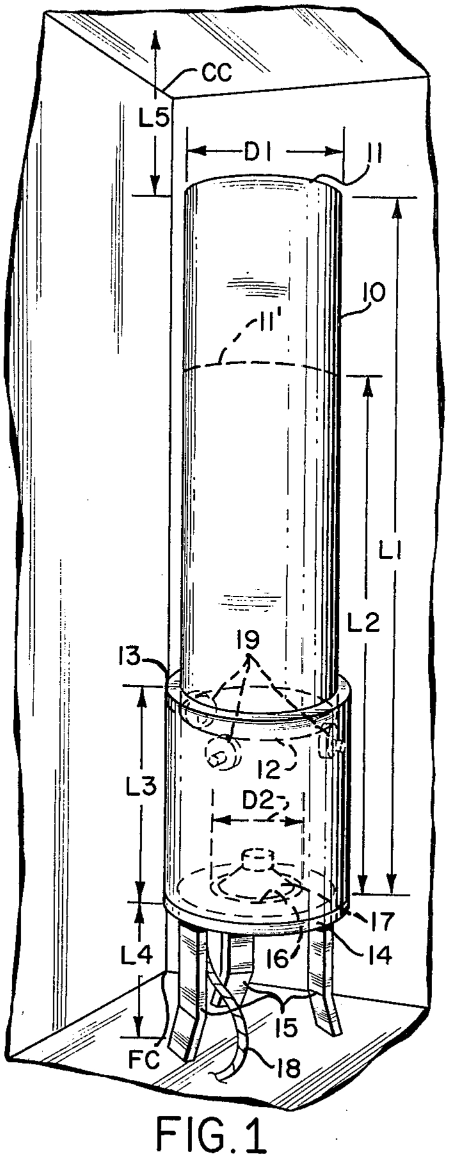
FIG. 1 is a perspective view of the preferred embodiment of the sound speaker system shown disposed in the corner of a room.

Referring first to FIG. 1, there is shown an elongated vertical cylinder 10 having upper and lower open ends 11 and 12. In the particular embodiment illustrated in FIG. 1 there is provided a secondary cylinder 13 telescopically receiving the lower open end 12 of the cylinder 10. A base stand includes a flat horizontal circular surface 14 supporting the lower end of the secondary cylinder 13 and including legs 15 secured to its underside.

As indicated by the dotted lines in FIG. 1, the flat surface 14 of the base stand includes a central opening 16 over which is positioned a loudspeaker 17. Speaker wires for the speaker 17 extend through an auxiliary opening in the flat surface 14 from the lower portion of the base stand as indicated at 18.

The basic structure is completed by the provision of stop means 19 three of which are indicated by the dotted lines serving to support the inner telescoped lower end of the elongated cylinder 10 in a given telescoped position with respect to the secondary cylinder 13. These stop means can be removed so that the elongated cylinder 10 can telescope completely within the secondary cylinder 13 to rest on the surface 14. This latter situation is depicted by the dotted lines wherein the upper open end of the elongated cylinder 10 is indicated at 11'.

In FIG. 1, the overall length of the elongated cylinder 10 and secondary cylinder 13 when in the solid line positions shown, is designated L1. The length of the elongated cylinder 10 itself is indicated at L2, while the length of the secondary cylinder 13 is designated L3.

When the speaker system is used in a room, the base stand supports the lower end of the secondary cylinder 13 at a distance L4 above the floor while the upper open end of the elongated cylinder 10 is at a distance L5 from the ceiling. Preferably, the speaker system is disposed in the corner of a room when in use such that the intersection of the walls and the floor define a floor corner designated FC and the intersection of the walls with the ceiling provide a ceiling corner CC. Sound emanating from the lower and upper ends of the cylindrical arrangement is thus guided out into the room by the floor and ceiling corners.

It will further be noted in FIG. 1 that the inside diameter of the elongated cylinder 10 is D1 while the diameter of the loudspeaker is shown as D2.

In accord with the present invention, the length L2 of the elongated cylinder 10 is an integral multiple greater than 2 of the inside diameter D1. Moreover, the length L3 is made at least equal to the inside diameter D2 and preferably slightly greater. The arrangement is such that when the elongated cylinder 10 is supported by the stop means 19 in the position illustrated in FIG. 1, the overall length of the elongated cylinder 10 and secondary cylinder 13 is one integral greater than the integral multiple of the inside diameter D1. The nominal diameter of the speaker D2 is made equal to one half the inside diameter D1.

Figure 2:
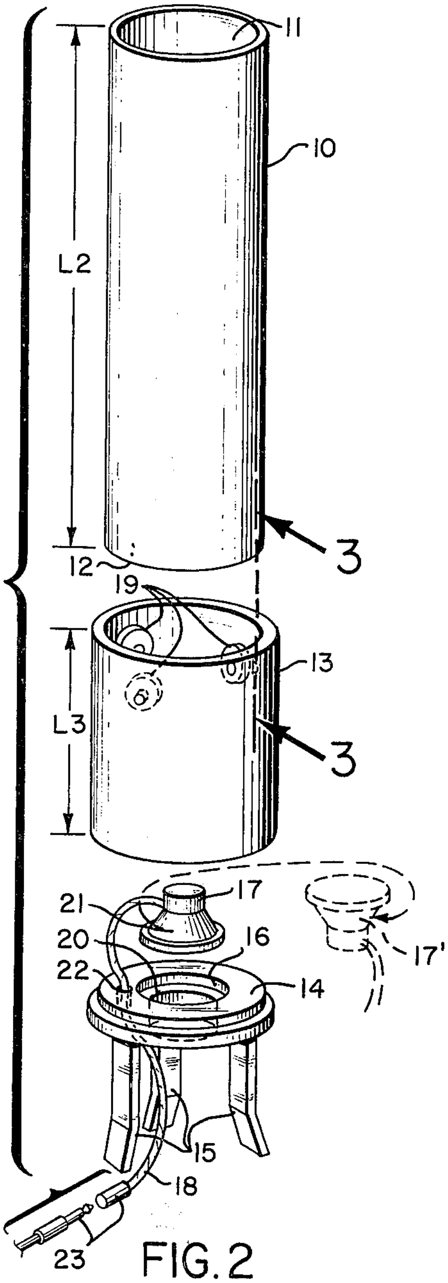
FIG. 2 is an exploded perspective view of the basic components making up the sound speaker system of FIG. 1.

Further details of the speaker system will be evident by now referring to the exploded view of FIG. 2. In FIG. 2 it will be noted that the central opening 16 of the flat horizontal surface 14 for the base stand defines an annular ledge 20. This ledge is arranged to receive and support the outer periphery of the speaker cone 21 when the speaker 17 is disposed in the central opening A small hole 22 receives the speaker wires 18 as described.

It will be noted that the speaker wires include a conventional plug and receptacle shown at 23 permitting the wire 18 to be disconnected so that it may be drawn up through the opening 22 and the entire speaker 17 with the speaker wire 18 extending downwardly through the central opening 16 to be turned over as indicated by the dotted lines at 17' and repositioned in the central opening 16. In this position, the periphery 21 of the cone is again supported by the annular ledge 20 and the speaker wire 18 extending from the bottom of the speaker can be reconnected by the connectors 23. In this latter position, sound will be directed vertically upwardly.

As shown in the central portion of FIG. 2, the various stop means take the form of three eccentric cam discs spaced 120° about the inner cylindrical surface of the secondary cylinder 13. These stop means thus support the lower end opening 12 of the elongated cylinder 10 at three spaced points. Preferably, each of the stop means 19 is adjustable so that slight telescoping adjustments of the position of the elongated cylinder 10 relative to the secondary cylinder 13 can be made.

Figure 3:
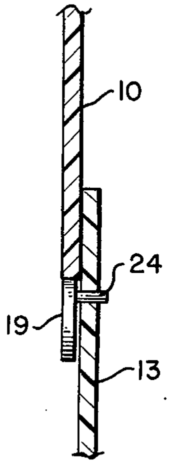
FIG. 3 is a fragmentary cross section taken in the direction of the arrows 3—3 of FIG. 2 when the components are assembled illustrating an adjustable stop means in a first position.
Figure 4:
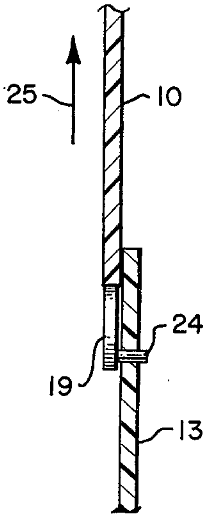
FIG. 4 is a view similar to FIG. 3 but illustrating the stop means in a second position; and, FIG. 5 is a perspective view of the stop means.

Referring specifically to FIGS. 3 and 4, the manner in which the stop means can be adjusted will be understood. Thus, as shown in FIG. 3, the disc 19 is eccentrically mounted on a screw 24 which extends into the wall of the secondary cylinder 13. In the position illustrated in FIG. 3, the elongated cylinder 10 is in its lowest telescoped position when supported by the stop means.

By now rotating the disc 19 about the screw, the cylinder is raised to any desired position, after which the screw is tightened. The maximum position is illustrated in FIG. 4. The upper movement of the cylinder 10 is indicated by the arrow 25.

The foregoing adjustment of all three of the stop means permits slight changes to be made in the overall length L1 described in FIG. 1 for compensating for temperature and humidity changes as will become clearer when the operation is described.

Figure 5:
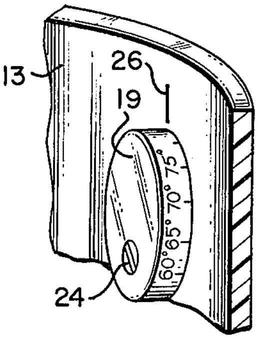

FIG. 5 shows temperature values on the periphery of the disc 19 which can be aligned with marker 26 on the interior wall of the secondary cylinder 13 in adjusting the telescoped position to take into account temperature changes.

Figure 6:
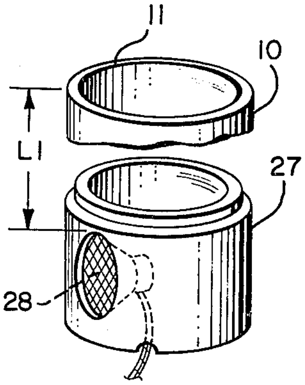
FIG. 6 is a perspective view of a modified base stand and speaker position.

FIG. 6 shows an alternative arrangement for the speaker wherein rather than the base stand specifically shown in FIGS. 1 and 2, this base stand takes the form of a cylindrical member 27 resting on the floor wherein a speaker 28 is supported in a lateral wall. In the arrangement of FIG. 6, the distance L1 described in FIG. 1 is measured from the upper peripheral point of the speaker to the top end opening 11 of the cylinder 10.

The foregoing structure described can be very economically manufactured. The elongated cylinder and secondary cylinder can be made of any suitable material which essentially is impervious to air and is provided with a smooth inner cylindrical surface. A simple roll of sheet metal or even cardboard could be used.

OPERATION

The specific dimensions of a preferred embodiment, by way of example, have already been set forth. Thus with particular reference to FIG. 1, when the elongated cylinder 10 and secondary cylinder 13 are in their extended position as shown in solid lines, the overall length L1 is 64 inches (162.56 centimeters) plus or minus a slight amount depending on temperature. By removing the stop means 19 and permitting the elongated cylinder 10 to be telescoped completely within the secondary cylinder 13, the overall length will then correspond to the length L2 of the elongated cylinder 10 itself; that is, 48 inches (121.92 centimeters). It will be appreciated, accordingly, that with the particular embodiment of FIG. 1 either of the two ideal lengths can be achieved.

In addition, when the speaker system is positioned in the corner of a typical room as described in FIG. 1, the length L4 corresponding to the distance of the speaker cone above the floor is made equal to the length L5 between the upper opening 11 and the ceiling. In this manner there is balanced guidance from the floor and ceiling corners of sound emitted from opposite ends of the cylindrical arrangement in the manner of an exponential horn thus providing optimum performance. In this respect, moving the cylinder in toward the corner increases the bass volume while moving the system out from the corner lowers the bass effect.

Since the speed of sound varies with temperature and relative humidity, fine tuning of the overall length can be achieved by rotating the camming discs making up the stop means described in FIGS. 3 and 4 to positions intermediate the two positions shown. In other words, as described heretofore, the length dimensioning of the overall structure can be adjusted for slight changes in predominant wave length to compensate for changes in temperature or humidity.

It will be understood that the dimensioning is such as to enhance desirable frequencies in the sound spectrum and this desirable result can be controlled to some extent by the position of the loudspeaker itself. If the speaker is positioned to face downwardly as described in the preferred embodiment of FIGS. 1 and 2, the high frequency volume is decreased while if the speaker is turned over to face vertically upwardly the high frequency volume is increased.

The assembly of the various components which as already noted can be extremely economically manufactured, requires no special skills. Thus, the user would first position the loudspeaker in the central opening 16 of the base stand. Thereafter, the secondary cylinder 13 is placed over the speaker and finally the elongated cylinder 10 is positioned on the stop means.

Various minor changes such as the exterior dress of the overall system can be made without departing from the scope and spirit of this invention. The sound speaker system accordingly is not to be thought of as limited to the specific details as shown in the drawings.

What is claimed is:

1. A sound speaker system including:

a. A first elongated vertical cylinder having upper and lower open ends, a given inside diameter and a given length, said length constituting an integral multiple greater than 2 of said given inside diameter;

b. a secondary cylinder of length at least equal to said given inside diameter of said first elongated cylinder, said secondary cylinder telescopically receiving the lower open end of said first elongated cylinder;

c. stop means for supporting said first elongated cylinder in a given telescoped position in said secondary cylinder;

d. a loudspeaker having a nominal given diameter equal to ½ said inside diameter of said first elongated cylinder disposed in the lower end of said secondary cylinder so that the overall length of the elongated and secondary cylinders can be adjusted to equal at least one integral multiple greater than the integral multiple of said inside diameter defining the length of said first elongated cylinder only; and e. a base stand supporting said loudspeaker and lower open end of said secondary cylinder a given distance above the floor so that sound can freely pass from both the upper and lower open ends of the telescoped cylinders.

2. A system according to claim 1, in which said stop means are adjustable in position so that said overall length can be adjusted in amounts to compensate for temperature changes.

3. A system according to claim 2, in which said base stand further includes a flat horizontal circular surface with legs secured to its underside, said secondary cylinder being supported on said surface, said surface having a central opening defining an annular ledge for receiving and supporting said loudspeaker when said loudspeaker is facing vertically downwardly, the loudspeaker cone resting on the ledge such that said loudspeaker can be removed and turned over and positioned in said central opening with the rear periphery of the cone being supported by the ledge so that the loudspeaker is facing vertically upwardly.

* * * * *